United States Patent
Staude et al.

(10) Patent No.: US 12,202,497 B2
(45) Date of Patent: Jan. 21, 2025

(54) SYSTEM FOR AUTOMATICALLY MONITORED SIGNALLING OF A VEHICLE STATE AND METHOD FOR MONITORING A VEHICLE STATE-SIGNALLING DEVICE

(71) Applicant: Valeo Schalter und Sensoren GmbH, Bietigheim-Bissingen (DE)

(72) Inventors: Sascha Staude, Bietigheim-Bissingen (DE); Raphael Mack, Bietigheim-Bissingen (DE); Benjamin Dietz, Bietigheim-Bissingen (DE); Landry Tandjeu Tchuissi, Bietigheim-Bissingen (DE)

(73) Assignee: VALEO SCHALTER UND SENSOREN GMBH, Bietigheim-Bissingen (DE)

( * ) Notice: Subject to any disclaimer, the term of this patent is extended or adjusted under 35 U.S.C. 154(b) by 900 days.

(21) Appl. No.: 17/262,074

(22) PCT Filed: Jun. 27, 2019

(86) PCT No.: PCT/EP2019/067169
§ 371 (c)(1),
(2) Date: Jan. 21, 2021

(87) PCT Pub. No.: WO2020/020566
PCT Pub. Date: Jan. 30, 2020

(65) Prior Publication Data
US 2021/0163028 A1    Jun. 3, 2021

(30) Foreign Application Priority Data
Jul. 26, 2018    (DE) .................... 10 2018 118 057.8

(51) Int. Cl.
*B60W 50/04* (2006.01)
*B60W 50/02* (2012.01)
(Continued)

(52) U.S. Cl.
CPC ........ *B60W 50/04* (2013.01); *B60W 50/0205* (2013.01); *B60W 50/0225* (2013.01);
(Continued)

(58) Field of Classification Search
None
See application file for complete search history.

(56) References Cited

U.S. PATENT DOCUMENTS 4,013,947 A    3/1977 Arai
10,502,786 B2 *  12/2019 Nowicki ............ G01R 31/3277
(Continued)

FOREIGN PATENT DOCUMENTS

CA    2669464 A1    10/2009
CN    1307321 A    8/2001
(Continued)

OTHER PUBLICATIONS

Office Action issued in counterpart Chinese Application No. 201980059858.6, issued May 15, 2023 (20 pages).
(Continued)

*Primary Examiner* — Adam D Tissot
(74) *Attorney, Agent, or Firm* — Osha Bergman Watanabe & Burton

(57) ABSTRACT

The invention relates to a system for the monitored signalling of a vehicle state, in particular for the monitored signalling of an activated, at least partially automated, driving operating state of a motor vehicle and to a method for the automatic monitoring of a vehicle state-signalling device. Specifically, the invention relates not only to the system and to the method but also to a monitoring device for carrying out the method, to a computer program which is configured to execute the method and to a vehicle state-signalling device and to a vehicle, in particular to a motor vehicle, equipped with the system. In the method, a first
(Continued)

Figure 1:
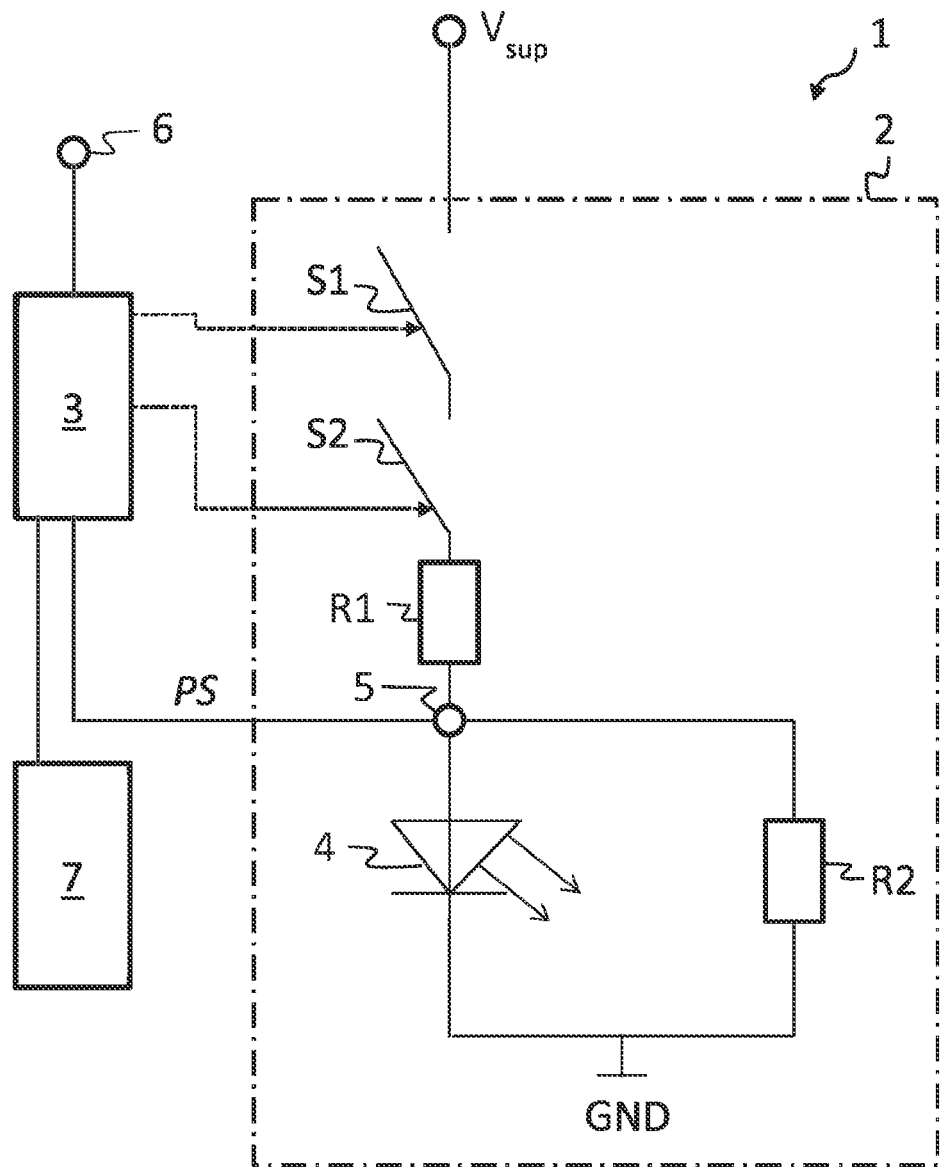

control signal, which is configured to change an assigned signal encoder of the vehicle state-signalling device into a deactivated state, is transferred to the vehicle state-signalling device. Testing of a current actual operating state of the signal encoder is then carried out. If the testing reveals that the signal encoder is in an activated operating state despite the transferred control signal, at least one predetermined fault remedying action which is assigned to this test result is triggered.

18 Claims, 7 Drawing Sheets

(51) Int. Cl.
| | |
|---|---|
| *B60W 50/14* | (2020.01) |
| *B60W 60/00* | (2020.01) |
| *G01R 31/00* | (2006.01) |
| *B60Q 1/44* | (2006.01) |
| *G01R 31/26* | (2020.01) |
| *G01R 31/44* | (2020.01) |
| *H04L 1/00* | (2006.01) |
| *H04L 67/12* | (2022.01) |

(52) U.S. Cl.
CPC .......... *B60W 50/14* (2013.01); *B60W 60/001* (2020.02); *G01R 31/006* (2013.01); *B60Q 1/44* (2013.01); *B60Q 2400/20* (2013.01); *G01R 31/2635* (2013.01); *G01R 31/44* (2013.01); *H04L 1/0025* (2013.01); *H04L 67/12* (2013.01)

(56) References Cited

U.S. PATENT DOCUMENTS

| | | | |
|---|---|---|---|
| 11,541,758 B2* | 1/2023 | Gauthier | H02J 1/08 |
| 2007/0085510 A1* | 4/2007 | Asada | H02P 29/032 |
| | | | 322/28 |
| 2009/0042529 A1 | 2/2009 | Lindenmeier et al. | |
| 2013/0241311 A1* | 9/2013 | Iwanabe | H04L 1/0082 |
| | | | 307/112 |
| 2014/0081509 A1* | 3/2014 | Koch | B60R 16/0232 |
| | | | 701/29.2 |
| 2015/0142386 A1 | 5/2015 | Vaucher et al. | |
| 2016/0328888 A1* | 11/2016 | Lee | G07C 5/0825 |

FOREIGN PATENT DOCUMENTS

| | | | | |
|---|---|---|---|---|
| CN | 2732551 Y | 10/2005 | | |
| CN | 101585358 A | 11/2009 | | |
| CN | 103538479 A | 1/2014 | | |
| CN | 104627186 A | 5/2015 | | |
| CN | 107076793 A | 8/2017 | | |
| CN | 107848462 A | 3/2018 | | |
| CN | 108068729 A | 5/2018 | | |
| DE | 19606896 A1 | 8/1997 | | |
| DE | 10340165 A1 | 3/2005 | | |
| DE | 102008002154 A1 | 12/2009 | | |
| DE | 102007056519 B4 | 4/2012 | | |
| DE | 102011121092 A1 | 6/2013 | | |
| DE | 102013110865 A1 | 4/2015 | | |
| DE | 102013221182 A1 | 4/2015 | | |
| DE | 102014014938 A1 | 4/2016 | | |
| DE | 102016217518 A1 | 3/2018 | | |
| EP | 3090911 A1 * | 11/2016 | ............ | B60K 35/00 |
| FR | 3026574 A1 | 4/2016 | | |
| GB | 2025101 A | 1/1980 | | |
| WO | 2016073925 A1 | 5/2016 | | |

OTHER PUBLICATIONS

International Search Report and Written Opinion issued in corresponding International Patent Application No. PCT/EP2019/067169, mailed Oct. 16, 2019 (11 pages).

German Search Report issued in corresponding German Application No. 10 2018 118 057.8 dated Oct. 19, 2018 (7 pages).

Yang et al. "Automatic monitoring circuit for motor vehicle signal failure", Electronic Technology Applications, Jun. 7, 1998. vol. 6.

Office Action issued in counterpart Chinese Application No. 201980059858.6, dated Dec. 12, 2023 (17 pages).

Office Action issued in Chinese Patent Application No. 201980059858.6, dated Apr. 19, 2024 (12 pages).

* cited by examiner

SYSTEM FOR AUTOMATICALLY MONITORED SIGNALLING OF A VEHICLE STATE AND METHOD FOR MONITORING A VEHICLE STATE-SIGNALLING DEVICE

The invention relates to a system for the monitored signalling of a vehicle state, in particular for the monitored signalling of an activated, at least partially automated, driving operating state of a motor vehicle and to a method for the automatic monitoring of a vehicle state-signalling device. Specifically, the invention concerns, as independent partial aspects or the system, not only the system but also a monitoring device for carrying out the method, a computer program which is configured to execute the method as well as a vehicle state-signalling device and a vehicle, in particular a motor vehicle, which is equipped with the system.

In vehicle engineering, in particular in motor vehicle engineering, a wide variety of signalling elements, in particular display elements, such as lighting means or screens, are generally used to signal specific vehicle states to a user of the vehicle, in particular to the driver thereof. Such lighting means can be or contain, in particular, light-emitting diodes. In addition to such optical signalling means, alternatively or additionally acoustic signalling means are generally found, for example for signalling the activity of a direction indicator (flashing indicator light). In this context it is possible to differentiate between safety-relevant and non-safety-relevant signalling operations. It is possible to categorize signalling of the activity of an air-conditioning system for the passenger compartment of a vehicle as generally not relevant to safety, while the signalling of the state of activation of a handbrake or else of an at least partially automated driving mode of the vehicle to the driver is generally to be categorized as relevant to safety. Such a categorization of the signalling of a vehicle state, such as for example of a driving operating mode, as safety-relevant can, in particular, also be defined legally.

In particular, with regard to the safety-relevant signalling operations, functionalities or states of a motor vehicle which can be activated and deactivated can also be further differentiated in respect of whether the activated or the deactivated state or a corresponding signalling operation of the active or deactivated state of the corresponding signalling operation is to be categorized as safety-critical. For example, a brake light is typically part of a first group of cases in which it is to be considered critical in terms of safety if the signalling (brake light lights up) does not take place even though it should light up owing to a current vehicle state (ongoing braking process). The activated state of the brake light is generally to be categorized as safety-critical since a failure of the brake light constitutes a safety risk, in particular with respect to the risk of a tail end collision. The deactivated, i.e. switched-off, state of the brake light is, on the other hand, typically not to be categorized as safety-critical, at any rate not to the same extent.

However, besides this, a second group of cases is conceivable, which relates to the opposite case in which it is to be considered critical in terms of safety if the signalling operation occurs even though it should not occur owing to a current vehicle state.

The present invention relates to this second group of cases and is based on the object of further improving the safety of such a vehicle state-signalling operation.

This problem is solved according to the teaching of the independent claims. Various embodiments and developments of the invention are the subject matter of the dependent claims.

A first aspect of the invention relates to a method for the automatic monitoring of a vehicle state-signalling device, in particular a device for signalling an activated, at least partially automated, driving operating state of a motor vehicle. The method comprises: (i) transferring a first control signal to the vehicle state-signalling device which is configured to change an assigned signal encoder of the vehicle state-signalling device into a deactivated state; (ii) subsequently testing a current actual operating state of the signal encoder; and (iii) if the testing reveals that the signal encoder is in an activated state despite the transferred control signal, triggering of at least one predetermined fault remedying action which is assigned to the testing.

By means of the method, the first control signal is therefore firstly used to set the setpoint operating state of the signal encoder to "deactivated" so that it is subsequently no longer active, i.e. will not output any signalling. However, fault situations are conceivable, for example short-circuits, malfunctions of switches or signal interruptions relating to control signals, which lead to a situation in which, despite the emission of the first control signal, the signal encoder actually continues to be active, i.e. to execute an associated signalling operation. Such fault situations can be detected by testing the actual operating state which, in the case of a fault can deviate from the operating state requested by means of the first control signal, so that, in reaction to the detection of a fault situation, the associated fault remedying action can be triggered in order to mitigate the safety-critical situation. Overall, the method therefore performs automatic monitoring of the vehicle state-signalling device with respect to the situation in which the signalling takes place even though it currently should not do so owing to an assigned current vehicle state. In this way, an improvement in the safety of the corresponding signalling of the vehicle state can be achieved by means of the fault remedying action triggers according to the method in the detected fault situation.

The term "vehicle state-signalling device" is to be understood according to the invention as a device which is configured to signal a state of an assigned vehicle to a user of the vehicle, in particular the driver thereof, by means of a human-machine interface. The signalling here can be carried out by means of a corresponding signal encoder, in particular optically, acoustically and/or haptically. For example, the signalling can be carried out by means of at least one lighting means, such as for example a light-emitting diode, as a signal encoder, or else by means of a message on a screen, if appropriate by means of additional sound signalling via a loudspeaker as a signal encoder. The signalled state of the vehicle can relate in particular also to an operating mode of the vehicle. Such an operating mode can be, in particular, a partially automated, highly automated or even autonomous driving operating state of a correspondingly automated vehicle. For sensing the vehicle state which is to be signalled, the vehicle state-signalling device can either have a corresponding sensor system itself or else can have a signal input via which it receives a corresponding signal which characterizes the vehicle state to be signalled. Such a signal can be received in particular from a control apparatus of the vehicle.

The term "testing a current actual operating state of the signal encoder" is to be understood according to the invention as meaning, in particular, testing which is brought about with technical means, particularly measurement, to determine whether the signal encoder is activated at the time under consideration, and correspondingly outputs the signalling which is assigned to it as a function of the associated vehicle state or else is deactivated when the signal fails to occur, i.e. it is in a deactivated state in which it does not output the signalling. The deactivated state can correspond here, in particular, to a completely switched-off state, or else to a state of rest in which the signal encoder is indeed supplied with energy but is not currently outputting the signalling, for example a light signal, because corresponding actuation is not occurring. Said state can be, in particular, also a particular diagnostic state which is specifically used to carry out the testing step.

The term "changing" the signal encoder into a deactivated state", which can be done, in particular, by means of a corresponding command contained in the first control signal or switching signal, is to be understood according to the invention as meaning, in particular, also the case in which a deactivated state which is already present is maintained. The changing of the signal encoder into the deactivated state can be carried out, in particular, directly, i.e. by correspondingly influencing the signal encoder itself, or indirectly by influencing a corresponding process of actuating the signal encoder.

The term "fault remedying action" according to the invention is to be understood as meaning an action of the vehicle state-signalling device itself and/or a further device which has a signal-conducting connection thereto and is provided and suitable to be brought about, directly or indirectly after its triggering, as a countermeasure to the fault which has already been detected by means of the testing. A fault remedying action can correspondingly either automatically cause negative effects of the faults to be remedied or at least alleviated, or it can also be limited to involving a human user, for example if it comprises the outputting of a corresponding warning message or request for action to the user.

By means of the method, the first control signal is therefore firstly used to set the setpoint operating state of the signal encoder to "deactivated" so that it is subsequently no longer active, i.e. will not output any signalling. However, fault situations are conceivable, for example short-circuits, malfunctions of switches or signal interruptions relating to control signals, which lead to a situation in which, despite the emission of the first control signal, the signal encoder actually continues to be active, i.e. to execute an associated signalling operation. Such fault situations can be detected by testing the actual operating state, which in the case of a fault can deviate from the operating state requested by means of the first control signal, so that, in reaction to the detection of a fault situation, the assigned fault remedying action can be triggered in order to mitigate the safety-critical situation. Overall, the method therefore performs automatic monitoring of the vehicle state-signalling device with respect to the situation in which the signalling takes place even though it currently should not do so owing to an assigned current vehicle state. In this way, an improvement in the safety of the corresponding signalling of the vehicle state can be achieved by means of the fault remedying action triggers according to the method in the detected fault situation.

In some embodiments, the fault remedying action comprises outputting a second control signal which is independent of the first control signal and which is configured to trigger at least one of the following processes, in particular at the vehicle state-signalling device or a vehicle controller. (i) changing the vehicle state-signalling device into a safe state, in particular deactivating the vehicle state-signalling device or just the signal encoder in a way which is independent of the first control signal; (ii) outputting a fault message to a human-machine interface.

Since the second control signal is independent of the first control signal, the changing of the vehicle state-signalling device into a safe state according to variant (i) can therefore be successful, i.e. can bring about the desired deactivation, even when the signal path for the transfer of the first control signal or its processing at the vehicle state-signalling device is disrupted. This can be implemented, for example, by means of two separate switches which can each bring about the safe state independently of one another. The variant (iii) corresponds to an indirect reaction to a detected fault situation by communicating same to a user so that the latter can adapt their behaviour, in particular their driving behaviour, to the fault situation which is signalled with this, in order therefore to remedy the risk to safety. In this case, the method performs monitoring including the communication of the results of the monitoring to a human user and, if appropriate, in combination with variant (i) additionally also performs automatic transfer of the vehicle state-signalling device into a safe state. In particular, variant (ii) can apply with respect to a fault situation in which the signalling signals at least partially automated apparent present control of the vehicle, for example by means of a corresponding display, even though only one manual driving mode is actually present, so that the driver must actually control and monitor the vehicle completely by themselves. The second control signal can be configured, in particular, to contain, for example, a corresponding command (in particular one which is represented in digital form) or a corresponding (in particular analogue) switching signal which causes the vehicle state-signalling device to change into a safe state (i) by means of self-deactivation overall or (ii) by means of selective deactivation of its affected signal encoder.

In some embodiments, the method (i) is repeated, in particular, at regular time intervals, and/or (ii) is carried out as a function of the vehicle state which is assigned to the vehicle state-signalling device overall or of a vehicle state which is assigned individually to the signal encoder. In this way, regular or continuous monitoring can be implemented, in particular on the basis of variant (i). Furthermore, monitoring which is defined selectively as a function of the assigned vehicle state can be implemented, in particular on the basis of variant (ii). With respect to the variant (ii) it is therefore possible to trigger the monitoring, for example, when a manual driving mode (vehicle state) is activated, so that, by means of the method, if appropriate, a fault situation can be detected in which, in contrast to the driving mode which is actually present, an at least partially automated driving mode is signalled by the vehicle state-signalling device or a specific signal encoder thereof.

In some embodiments, the vehicle state-signalling device has a multiplicity or signal encoders which differ from one another, at least in one signalling aspect, and the method is executed selectively only with respect to a first genuine subset of the signal encoders of the vehicle state-signalling device, individually per signal encoder or with respect to one or more predetermined combinations of signal encoders from the subset. The signal encoders can be, in particular, a multiplicity of optical signal encoders which differ with respect to their signal colour, or their signal effects (for example flashing, brightness, brightness profile, etc.). An example of this is a group of three signal encoders which are each embodied as light-emitting diodes, wherein each of the light-emitting diodes is a different colour, for example red, green and blue, wherein each light-emitting diode or signal colour is assigned a different vehicle state. Therefore, for example in the example mentioned above relating to various driving modes of the vehicle, the red light-emitting diode can be provided for signalling a manual driving mode (e.g. SAE level 0 defined by the "SAE International" organization), the blue light-emitting diode for signalling a partially automated driving mode (e.g. SAE level 1 or 2), and the green light-emitting diode for signalling a highly automated driving mode (e.g. SAE levels 3-5). The two automated driving mode levels can be categorized as safety-relevant, so that here the driver of the vehicle generally gives up at least some driving tasks to the automatic system, and there can therefore be a safety risk if the automatic system operates incorrectly or fails. Accordingly, the first subset of the signal encoders can be defined as the quantity composed of the blue and green light-emitting diodes, so that the monitoring takes place only with respect to these two signal encoders, while, in the manual driving mode, to which the red light-emitting diode is assigned, it is not necessary to monitor said diode, and the monitoring can therefore be omitted since, in this case, the driving task is in any case assigned completely to the driver.

A second aspect of the invention relates to a monitoring device which is configured to execute the method according to the above-mentioned first aspect of the invention with respect to a vehicle state-signalling device. The monitoring device can be implemented, in particular, as a single control apparatus (or part thereof) or as a group of a plurality of monitoring devices which are distributed over different devices, in particular control apparatuses, and are provided to interact within the scope of the execution of the method.

In some embodiments, the monitoring device has at least one test device which is configured to test a test signal, in particular an analogue or digital test signal, which is output at a test signal output of the vehicle state-signalling device, in order to determine a current operating state of the signal encoder of the vehicle state-signalling device on the basis of the test. In this way, the testing can be implemented particularly efficiently within the scope of the method. In particular, it is possible to dispense with an additional sensor system for detecting the operating state of the signal encoder, such as for example a light-sensitive sensor for sensing a lighting state of a lighting means which is used as a signal encoder. The test signal can be, in particular, a voltage signal or a current signal from which it is possible to infer the current operating state of the signal encoder. For example, the test signal can correspond to a voltage drop across the signal encoder or a current strength of an operating current flowing through it or of a variable derived therefrom. Therefore, for example, light-emitting diodes typically have a characteristic forward voltage during their operation so that, by measuring a test signal which corresponds to this characteristic forward voltage, it is possible to infer an activated state, i.e. illumination, of the light-emitting diode.

A third aspect of the invention relates to a computer program which is configured to carry out the method according to the first aspect of the invention when it is run on a monitoring device according to the second aspect.

The computer program can, in particular, be stored in a non-volatile data carrier. This is preferably a data carrier in the form of an optical data carrier or a flash memory module. This may be advantageous if the computer program as such is to be handled independently of a processor platform on which the one or more programs are to be run. In another implementation, the computer program can be present as a file on a data processing unit, in particular on a server, and can be downloaded via a data link, for example the Internet or a dedicated data link such as a proprietary or local network. In addition, the computer program can have a multiplicity of individual interacting program modules.

The monitoring device can correspondingly have a program memory in which the computer program is stored. Alternatively, the monitoring device can also be configured to access, via a communication link, a computer program which is available externally, for example on one or more servers or other data processing units, in particular in order to exchange therewith data which is used while the method or computer program is running, or constitutes outputs of the computer program.

The features and advantages which are explained with respect to the first aspect of the invention apply correspondingly also to the second and third aspects of the invention.

A fourth aspect of the invention relates to a vehicle state-signalling device, in particular a device for signalling an activated, at least partially automated, driving operating state of a motor vehicle. The vehicle state-signalling device has: (i) a signal encoder which is configured to output a state signal for signalling a vehicle state which is assigned to the signal encoder; and (ii) a circuit for actuating the signal encoder, in order to selectively activate or deactivate the latter in reaction to at least one corresponding control signal, in particular a corresponding control signal which is transferred by a monitoring device according to the second aspect of the invention. The circuit has a first switch and a second switch which can be switched independently thereof, as well as at least one test signal output for making available a test signal for testing a current operating state of the signal encoder. In addition, the circuit is configured in such a way that, to activate the signal encoder, the first and second switches must together have a specific predetermined switched state combination, while switched state combinations of the switches which do not correspond to the specific switched state combination of the first and the second switch or do not contain the latter correspond to deactivation of the signal encoder.

This switch-based solution has the advantage that only the specific switched state combination brings about activation of the signal encoder, while there are a multiplicity of further switched states (at least one of the switches is in a different position than that which it assumes for the specific switched state combination) which correspond to a non-activated state of the signal encoder. If, for example, the activated state of the signal encoder corresponds to a closed switch position of the two switches, deactivation of the signal encoder can be brought about by means of any of the individual switches. In addition, each individual switch of the two switches can be tested with respect to its fault-free function, in particular its switching off, by opening it and closing the respective other switch. If it then becomes apparent during the testing that the signal encoder is activated despite the one opened switch, a malfunction of the actually "opened" switch can be inferred therefrom, since according to the test result said switch is actually having a current-conducting or signal-conducting effect, for example owing to a short circuit. Other specific switch combinations are also possible, as described below in conjunction with the further embodiments specified below.

In such switch-based embodiments ("variant 1"), the circuit has a voltage divider with two dipoles which are connected in series, and the test signal output is based on a switching point which is located between the two dipoles. The first and second switches are arranged in a first of the dipoles, in particular connected in series, and in the second of the dipoles the signal encoder is arranged, wherein the signal encoder can be activated by means of an operating voltage applied via the voltage divider, only when the first and the second switches are each in the closed switched state at the same time.

In this way it is possible to use other switch positions in which both switches are not closed simultaneously, to test the circuit. This applies, in particular, to switch positions in which one of the switches is closed and the respective other switch is opened. If the signal encoder is nevertheless active in such a case, it is possible to infer a fault in conjunction with the switch which is actually "opened" according to its actuation. Such a fault can be present, in particular, in the form of a short circuit or faulty actuation of the switch. In a similar way, it is possible to infer a fault with respect to both switches if the signal encoder is nevertheless active even though both switches are "opened" according to their actuation.

Whether the signal encoder is currently in an activated operating state or not can be sensed by means of an electrical measurement, in particular of a voltage potential present at the test signal output or a flow of current through the switching point from which the test signal output starts. At least one of the switch positions in which at least one of the switches is opened can therefore be used as a diagnostic position. Said position can differ, in particular, from another of these switch positions which is used for the regular switching off of the signal encoder. For example, the regular "off" position could correspond to an opened state of both switches, while the two positions in which one switch is respectively closed and the other opened can be respectively used as a diagnostic position within the scope of the testing of the actual operating state of the signal encoder. A safe state can then correspond, in particular, to the regular "off" position.

In some other switch-based embodiments ("variant 2") of this kind, the circuit again has a voltage divider with two dipoles which are connected in series, and the test signal output is based on a switching point which is located between the two dipoles. However, in this variant, the first switch is arranged in a first of the dipoles, and the second switch is arranged in the second of the dipoles. The signal encoder can be activated by means of an operating voltage applied via the voltage divider only when the first and second switches are each in the closed switched state at the same time. Otherwise, what has been stated with respect to variant 1 also applies correspondingly to variant 2.

In some embodiments ("variant 3") which respectively constitute a special case of variant 2, in the second dipole the second switch is connected parallel to the signal encoder, and the signal encoder can be actuated by means of an operating voltage applied via the voltage divider only when the first switch is in the closed switched state and at the same time the second switch is in the opened switched state. Therefore, for the regular activation of the signal encoder, the first switch has to be closed and the second switch has to be opened.

For the regular deactivation signal encoder, in particular the second switch can be closed, and optionally additionally also the first switch. A diagnostic position can then consist, in particular, in the fact that both switches are opened. If there is then a fault at the first switch (for example a short circuit) which causes the signal encoder to be supplied with power, a fault can be inferred at the first switch by means of the activity of the signal encoder. If, on the other hand, both switches are closed and the signal encoder is nevertheless actually active, it is possible to infer a malfunction of the second switch (i.e. it conducts current even though it should actually be opened according to its actuation). This variant has the additional advantage that, if the second switch is closed and therefore bypasses the signal encoder, a parasitic build-up of voltage at the signal encoder can be avoided, in particular if the latter contains one or more light-emitting diodes.

In some embodiments which can be used, in particular, in combination with any of the variants 1 to 3, the voltage divider is a loaded voltage divider at which the second dipole has a load which is connected parallel to the signal encoder. The load can be embodied, in particular, by means of what is referred to as a (e.g. ohmic) pulldown resistor. This has the advantage that a working point for the test signal output can be set by means of the selection of the load. In particular in this way it is possible to ensure that if the test signal output is not supplied by the operating voltage applied to the voltage divider owing to a corresponding switch position of the first switch in the first dipole, the test signal output is pulled to a lower potential, in particular earth potential, in order to obtain, instead of a fluctuating state, a defined potential or test signal at the test signal output, which potential or signal permits reliable differentiation from other switched states during the measurement at the test signal output.

A fifth aspect of the invention relates to a system for performing monitored vehicle state signalling, in particular a signalling device of an activated, at least partially automated, driving operating state of a motor vehicle. The system has a monitoring device according to the second aspect of the invention and a vehicle state-signalling device, which has a signal-conducting connection thereto, according to the fourth aspect of the invention.

In some embodiments, the system is divided between two or more different apparatuses, in particular control apparatuses for a vehicle. The first switch and the second switch of the vehicle state-signalling device are arranged in two different apparatuses of the apparatuses. In addition, the test signal output of the vehicle state-signalling device is connected to at least two of the apparatuses, and these at least two apparatuses are each configured to carry out the method according to the first aspect of the invention, individually or together with respect to the vehicle state-signalling device of the system. In this way, the safety can be increased further since the functionality of the system, in particular with respect to the testing of the actual current operating state of the at least one signal encoder, is distributed among different apparatuses. A diagnosis is therefore possible even if a fault situation occurs at one of the apparatuses which also prevents this actual apparatus from performing the diagnosis or the testing of the operating state of the signal encoder. A safe state can therefore then also be brought about by at least one of the other apparatuses.

In some embodiments, the vehicle state-signalling device has a multiplicity of signal encoders which differ from one another at least in a signalling aspect. The monitoring device is configured to execute, with respect to the vehicle state-signalling device, the method according to the first aspect of the invention individually in a selective fashion for each of the single encoders. In this way, the testing can be carried out with respect to each of the signal encoders individually and independently of the tests with respect to the other signal encoders, which permits, in particular, more precise delimitation or identification of any faults. In particular, such a system can additionally be configured such, that in the case in which the testing with respect to of the signal encoders reveals that this signal encoder is in an activated operating state despite the corresponding transferred control signal, said system deactivates this signal encoder selectively. In this way, a safe state in respect of this signal encoder can be brought about selectively without the functionality of the other signal encoders being adversely affected.

A sixth aspect of the invention relates to a vehicle, in particular a motor vehicle, which has a system according to the fifth aspect of the invention.

The features and advantages which are explained with respect to one or more of the respective different aspects of the invention also apply correspondingly to the respective fourth, fifth or sixth aspect of the invention. In addition, the embodiments of the various aspects of the invention which are described herein can be combined with one another as desired unless expressly stated otherwise or unless they exclude one another. This includes, in particular, combinations in which just one subset of all the described embodiments is applied.

Further advantages, features and application possibilities of the present invention can be found in the following detailed description in conjunction with the figures.

In this context, FIGS. 1 to 7 are respectively schematic views of selected exemplary embodiments of a system according to the invention, wherein these individual embodiments differ from one another. In the figures, the same reference signs are used throughout for the same or corresponding elements of the invention.

FIG. 1 represents a first embodiment of a system 1 according to the invention which has a vehicle state-signalling device 2 and a monitoring device 3. The vehicle state-signalling device 2 contains a loaded voltage divider composed of two dipoles, A first of the dipoles contains a series circuit composed of two switches S1 and S2 and an ohmic load resistor R1. The second of the dipoles contains a signal encoder 4, for example a light-emitting diode (as illustrated), parallel to which a pulldown resistor R2 is connected, therefore making the voltage divider the loaded voltage divider.

The voltage divider has an operating voltage connection $V_{SUP}$ and an associated earth connection GND so that, while it is operating, an operating voltage can be applied via the voltage divider. A test signal output 5 for a test signal PS, which has a signal-conducting connection to the monitoring device 3, starts from a connecting point (switching point) between the two dipoles. The two switches S1 and S2 can be controlled individually by the monitoring device 3 by means of corresponding switching signals. The monitoring device 3 can have, in particular, one or more processors as well as a memory (respectively not illustrated) in which a computer program, by means of which the method according to the invention is implemented, is stored.

If a vehicle state which is assigned to the signal encoder is present, which state is to be signalled by the signal encoder 4, the vehicle state-signalling device 2 is changed into an active operating state in that the two switches S1 and S2 are actuated by the monitoring device 3 in such a way that they are closed. The voltage divider therefore becomes conductive, and a current flows which is defined, in particular, by means of the two resistors R1 and R2 and the resistor of the signal encoder 4 and by means of which the signal encoder is activated, that is to say, in the exemplary case, the light-emitting diode is illuminated. If, on the other hand, the vehicle state which is assigned to the signal encoder 4 is not present, the vehicle state-signalling device 2 is changed into a deactivated operating state in that the two switches S1 and S2 are actuated by the monitoring device 3 in such a way that they are both opened, as a result of which the flow of current is interrupted and the signal encoder 4 is deactivated in the fault-free case. The sensing of the vehicle state assigned to the signal encoder can be carried out, in particular, by means of a sensor system (not illustrated) which is associated with the monitoring device 3 itself. Additionally or alternatively, the monitoring device 3 can, as illustrated, have a vehicle state signal input 6 via which it can receive a state signal which characterizes the vehicle state, for example from a vehicle controller or a system-external sensor system.

At predefined, regular time intervals, in particular when the vehicle state-sensing device 2 is in its deactivated operating state, the vehicle state-signalling device 2 is, according to the method, changed into a diagnostic state in that the two switches S1 and S2 are actuated by the monitoring device 3 by means of at least one first control signal in such a way that one of the two switches is opened and the other is closed. In the fault-free case, the signal encoder 4 should therefore be deactivated, since the opened switch interrupts the flow of current. In order to test whether the signal encoder 4 is nevertheless actually activated incorrectly, the voltage potential at the test signal output 5 is tapped and evaluated by the monitoring device 3. The voltage potential corresponds here to the voltage drop across the signal encoder 4.

If the signal encoder 4, here the light-emitting diode, is activated incorrectly, which can be caused, in particular, by the fact that the switch which is actually opened according to its actuation continues to be incorrectly closed or has a short circuit, a known forward voltage which is typical of the operation of the signal encoder 4 drops across said signal encoder 4. During the evaluation in the monitoring device 3, the latter can be detected as such, the activated state of the signal encoder 4 can be inferred therefrom and a corresponding fault remedying action can be triggered by means of at least one second control signal. The latter can consist, in particular, in the fact that the vehicle state-signalling device 2 is actuated by the monitoring device 3 by means of the at least one second control signal in such a way that, as a result, that switch of the two switches which is initially still closed is opened, and therefore the vehicle state-signalling device 2 is changed into the safe, completely deactivated operating state. Additionally or alternatively, a warning signal can be output in the case of a fault at a human-machine interface 7 which has a signal-conducting connection to the monitoring device. In the alternative case, i.e. in the actual fault-free case, the potential at the point 5 is pulled to earth potential GND by the pulldown resistor, which permits easy differentiation with respect to the fault situation.

As an alternative to the voltage measurement, in particular a measurement of current can be carried out at the switching point 5, in order to be able to infer the actual operating state of the signal encoder 4 from the measured current. This diagnostic process can be carried out either only for one of the two switches S1 and S2 or else successively for both switches.

Figure 2:
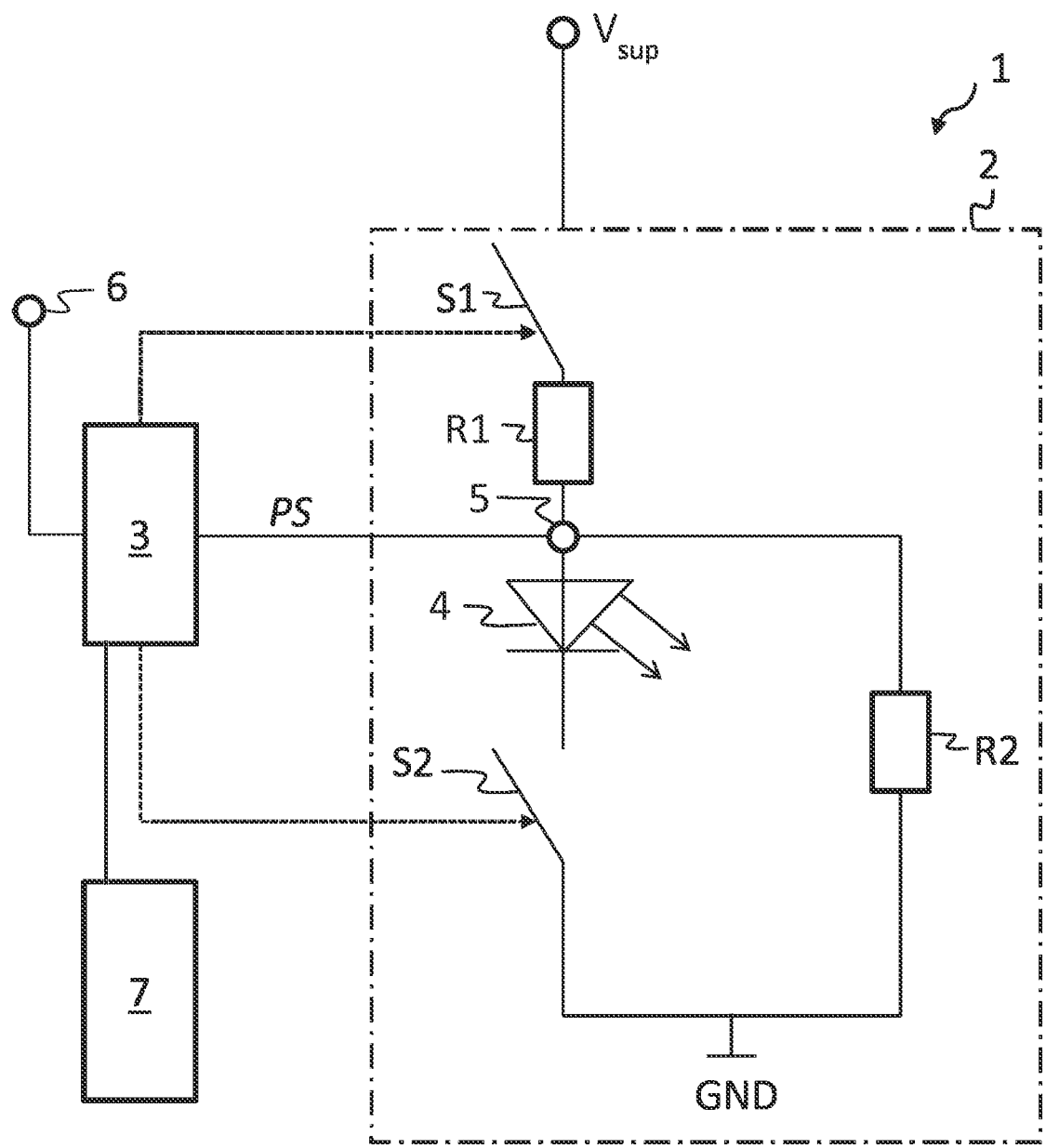

FIG. 2 shows a second alternative embodiment of the system 1, which differs from the embodiment illustrated in FIG. 1 in that the second switch S2 is now in the second dipole instead of being in the first dipole, and is connected in series with the signal encoder 4. With this circuit it is also the case that, in the fault-free situation, the signal encoder 4 is activated only when both switches S1 and S2 are closed. The operation of the circuit corresponds to that described above with respect to FIG. 1.

Figure 3:
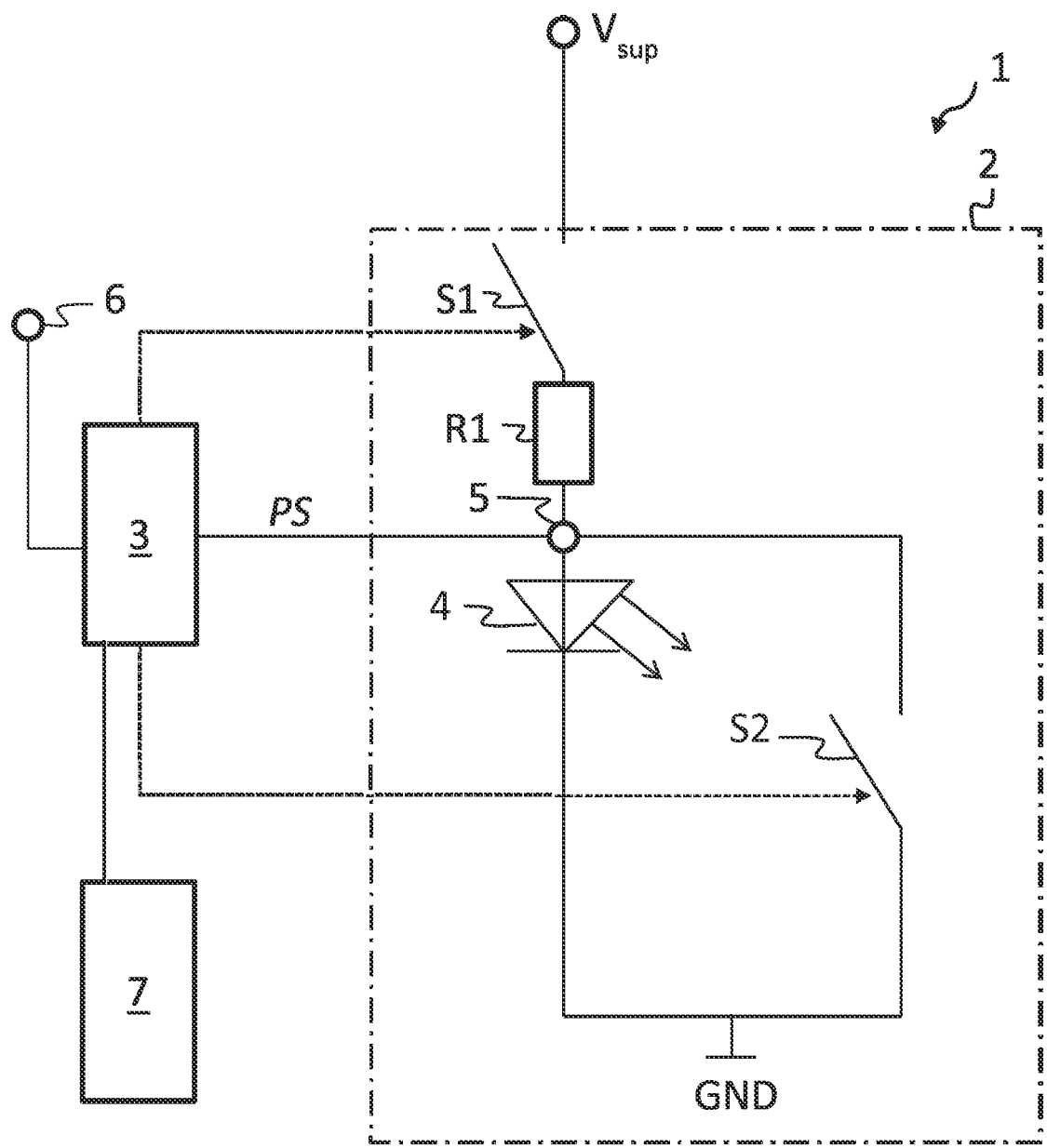

FIG. 3 shows a third alternative embodiment of the system 1, which differs from the embodiment illustrated in FIG. 2 in that, instead of being connected in series with the first signal encoder 4, the second switch S2 in the second dipole is now connected parallel to the signal encoder 4, instead of the resistor R2 (or in addition thereto). With this circuit it is also the case that, in the fault-free situation, the signal encoder 4 is activated only when the switch S1 is closed and the switch S2 is opened. The operation of the circuit corresponds otherwise to that described above with respect to FIG. 1.

According to the method, the vehicle state-signalling device 2 can correspondingly be changed into a diagnostic state if it is actuated by the monitoring device 3 in such a way that, in the fault-free situation, both switches S1 and S2 are opened. If the measurement at the signal test output in such a switch position reveals that the signal encoders 4 are nevertheless in the active state, this makes it possible to infer a malfunction of the switch S1 or of its actuation, for example a short circuit. Another diagnostic state of the vehicle state-signalling device 2 can consist in the fact that the monitoring device 3 actuates the vehicle state-signalling device 2 in such a way that, in the fault-free situation, both switches are closed. If the measurement at the signal test output 5 then reveals that the signal encoder 4 is nevertheless activated, this makes it possible to infer a malfunction of the switch S2 or of its actuation, for example a line break or some other type of interruption. This embodiment additionally has the advantage that, if the switch S2 is closed, any undesired voltages occurring at the signal encoder 4 are dissipated via the switch S2. This can be the case, in particular, if the signal encoding 4 is a light-emitting diode or some other semiconductor component with which intrinsically parasitic voltages can be generated under certain circumstances, in particular by externally inputting electromagnetic waves.

Figure 4:
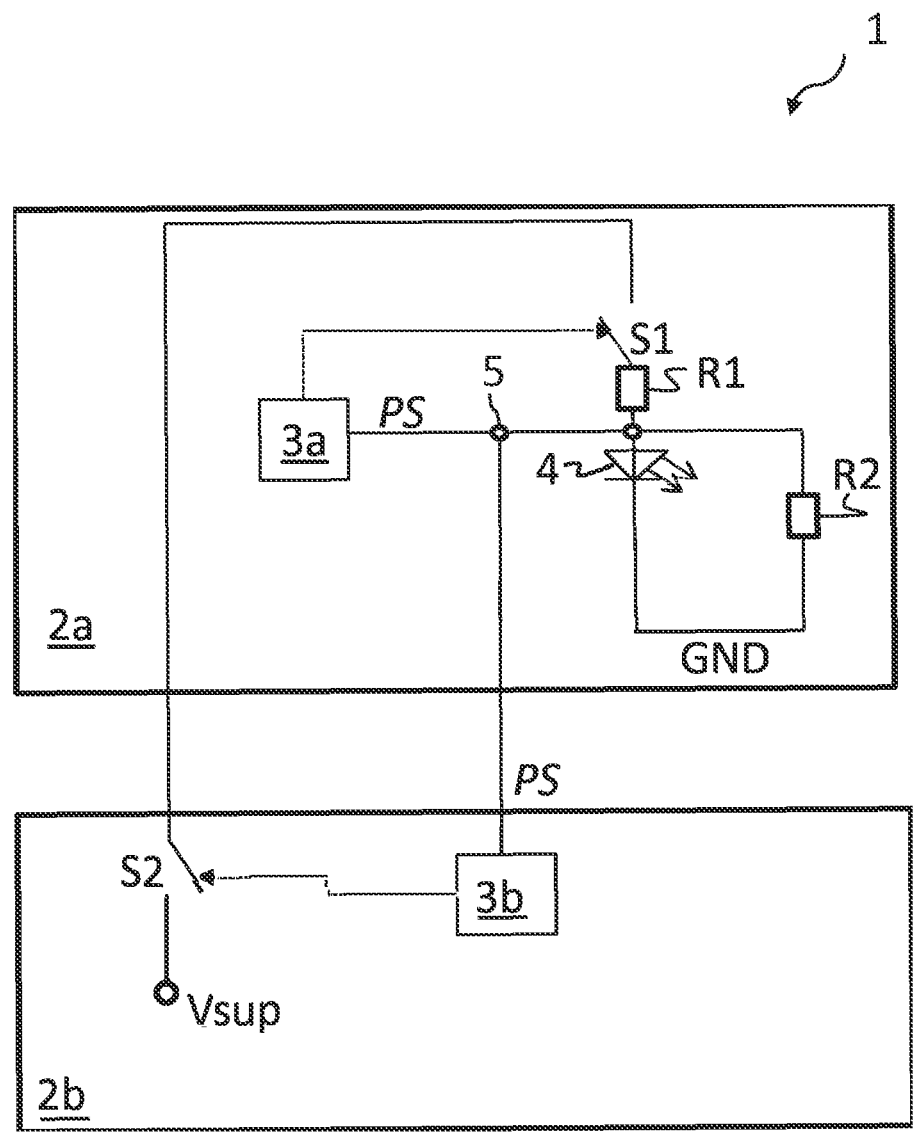

FIG. 4 shows a fourth, alternative embodiment of system 1, which corresponds largely to that in FIG. 1, but with the particular feature that the system 1 is constructed distributed between two different control apparatuses 2a and 2b. In this context, the control apparatus 2a at the same time constitutes the vehicle state-signalling device 2 of the system 1, while the monitoring device 3 is divided into two monitoring units 3a and 3b, wherein the monitoring unit 3a forms part of the control apparatus 2a, and the monitoring unit 3b forms part of the control apparatus 2b. Both monitoring units 3a, 3b are respectively connected to the test signal output 5 of the vehicle state-signalling device 2, in order to tap a test signal PS there. Each of the monitoring units 3a, 3b is configured to actuate that switch of the two switches S1 and S2 which is assigned to it, wherein each of the two control apparatuses 2a, 2b has one of the two switches S1 and S2 connected in series. The modular design composed of two control apparatuses 2a, 2b has, in particular, the advantage that, in the case of a defect, normally only one of the two control apparatuses 2a, 2b has to be exchanged. Furthermore, the testing by means of the test signal PS has a redundant design by virtue of the two monitoring units 3a, 3b so that a malfunction can be detected even if one of the two monk taring units 3a, 3b itself or its connection to the test signal output 5 is defective.

Figure 5:
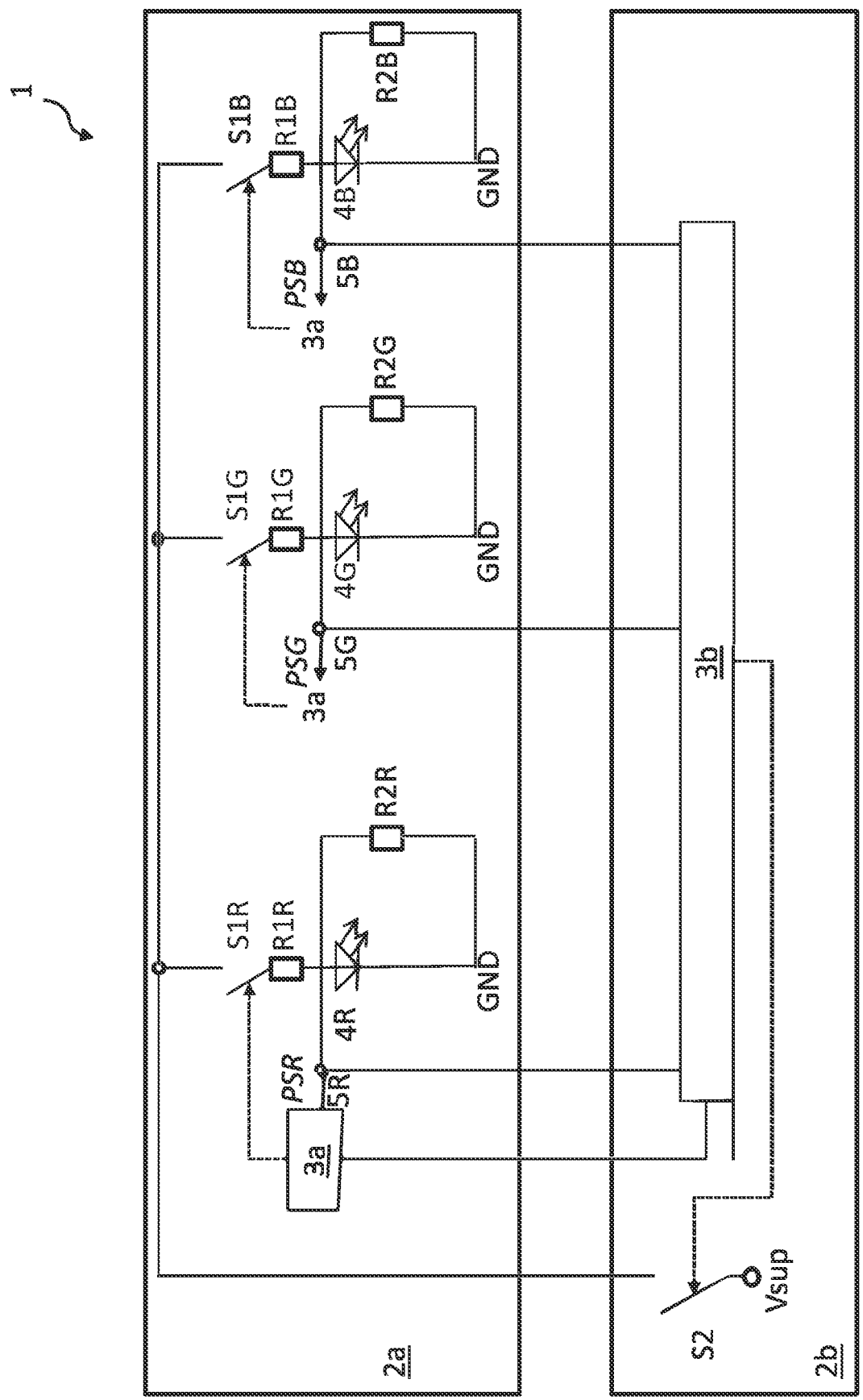

FIG. 5 shows a fifth, alternative embodiment of the system 1 which is derived from that from FIG. 4, but with the particular feature that a multiplicity of signal encoders 4R, 4G, 4B, each with corresponding wiring according to FIG. 4, are provided. However, the switch S2 is not embodied in respective separate fashion for each of the signal encoders 4R, 4G, 4B, but rather is implemented by a single switch which is jointly connected upstream of all of the signal encoders 4R, 4G, 4B. However, each signal encoder can be activated or deactivated individually by means of the respective individually provided other switch S1R, S1G or S1B if the switch S2 is closed. In analogous fashion to FIG. 4, respectively corresponding resistors R1R, R1G or R1B and R2R, R2G or R2B are provided for the individual wiring of the signal encoders 4R, 4G, 4B.

For each of the signal encoders 4R, 4G, 4B there is a corresponding individual test signal output 5R, 5G or 5B at which a corresponding test signal PSR, PSG or PSP can be tapped by the monitoring unit 3a. The various signal encoders 4R, 4G, 4B can be, in particular, lighting means, for example light-emitting diodes, which are combined in the same vehicle state-signalling device 2 and have different colours, as a result of which it is possible to form a display whose signalling comprises different colours or colour combinations depending on the associated vehicle state to be signalled. For example, a green light-emitting diode 4G could correspond to a highly automated driving state (i.e. driving mode) of a vehicle equipped with the system 1, a blue light-emitting diode 4B could correspond to a partially automated driving state, and a red light-emitting diode 4R could correspond to a manual driving state.

The test signals PSR, PSG and PSB can each be received as analogue signals and processed by the monitoring units 3a and 3b, Alternatively it is also conceivable to generate the test signals PSR, PSG and PSB as digital signals or to convert them into such signals and process them in a digital fashion in the monitoring units 3a and 3b. The latter can be carried out, in particular, by means of a diagnostic protocol, for example if the signal encoders are what are referred to as "smart LEDs". During the signal processing, the testing, and if appropriate the triggering of a fault remedying measure, such as for example the opening of the associated switch S1R, S1G to S1B in order to bring about a respective safe state, can be carried out individually for each of the signal encoders.

Figure 6:
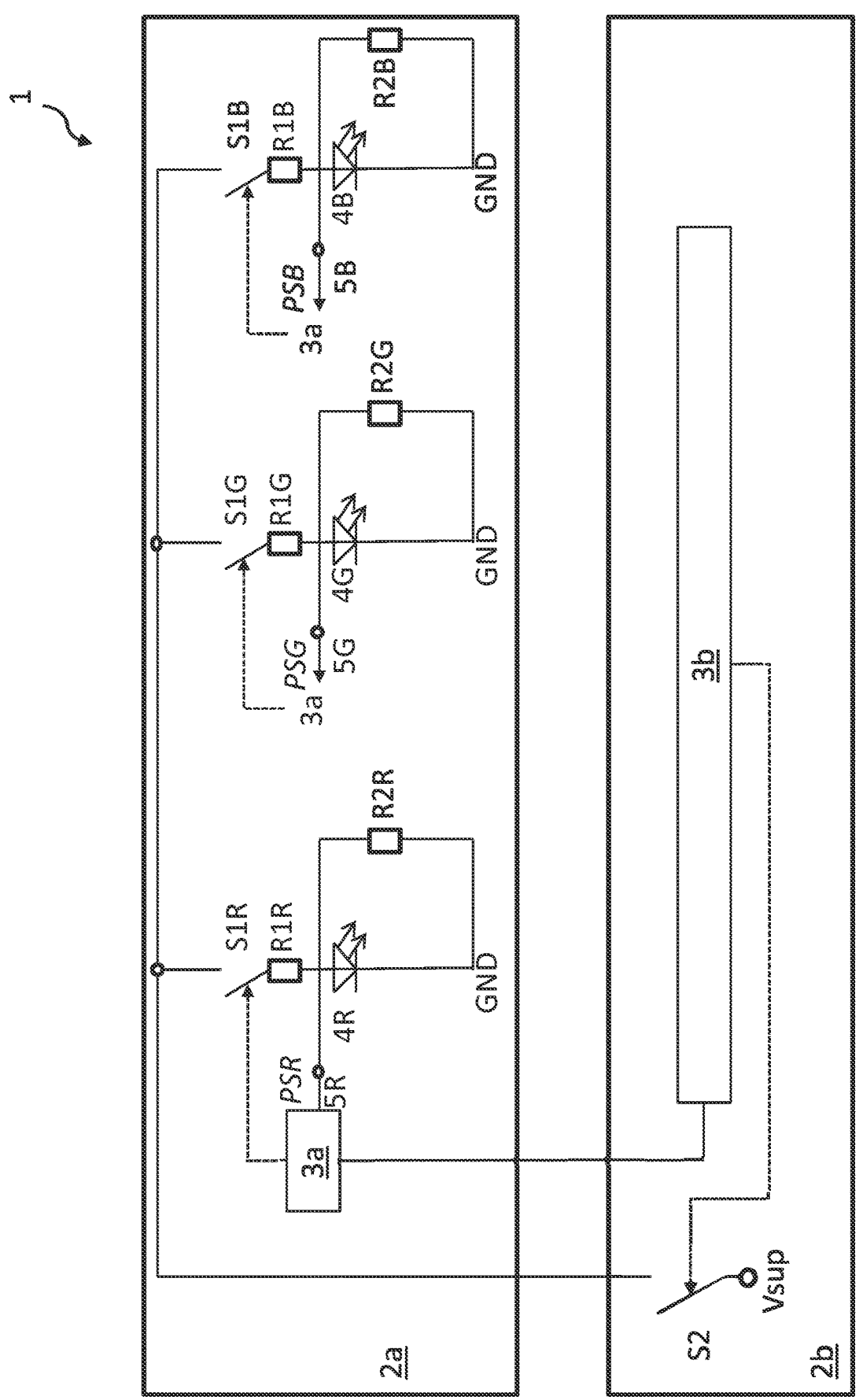

FIG. 6 shows a sixth, alternative embodiment of the system 1, which is derived from that in FIG. 5, but with the particular feature that here all the test signal outputs 5R, 5G and 5B are connected to the monitoring unit 3a and digitized there, and only from there are test signals, which are combined optionally by multiplex, transferred to the second monitoring unit 3b in the control apparatus 2b. The processing of the detected test signals PSR, PSG and PSB in the diagnostic mode occurs in a corresponding digital fashion.

Figure 7:
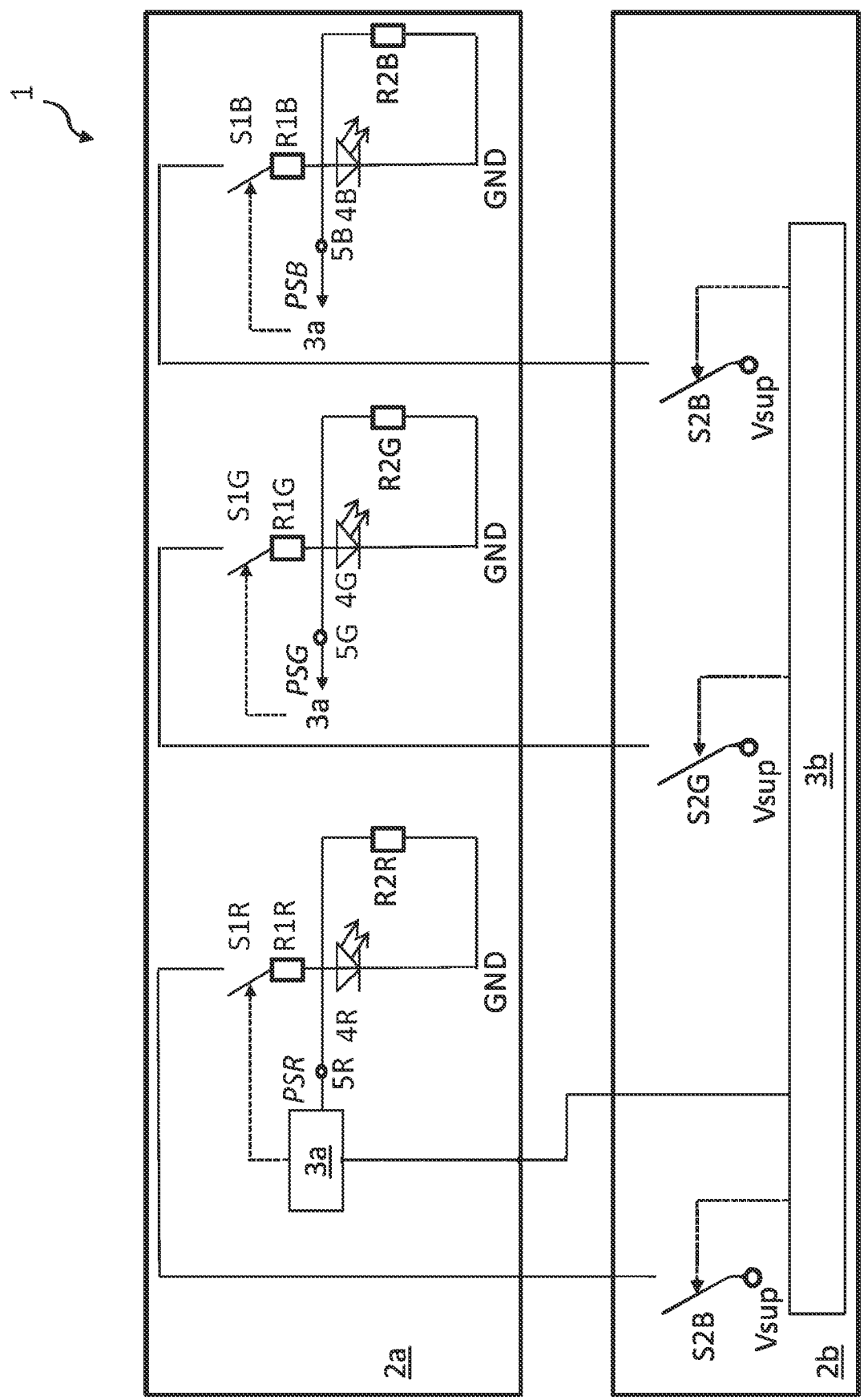

FIG. 7 finally shows a seventh, alternative embodiment of the system 1 which is derived from that in FIG. 6, but with the particular feature that the second switch S2 is now no longer embodied as a common switch but rather in each case individually by means of the switches S2R, S2G and S2B. This has the advantage that, in the case of a fault, each of the signal encoders 4R, 4G and 4B can be changed into a safe state individually by switching off by means of the corresponding switches S2R, S2G and S2B.

While at least one exemplary embodiment has been described above, it has to be noted that there are a large number of variations in this respect. It is also to be noted here that the described exemplary embodiments constitute only non-limiting examples and they are not intended to limit the scope, applicability or configuration of the devices and methods described here. Instead, the above description will provide a person skilled in the art with an indication for the implementation of at least one exemplary embodiment, with the understanding that various changes in the means of functioning and the arrangement of the elements described in an exemplary embodiment can be made without departing here from the subject matter which is respectively defined in the appended claims or its legal equivalents.

LIST OF REFERENCE SIGNS

1 System for monitored vehicle state signalling
2 Vehicle state-signalling device 2a, b Control apparatuses
3 Monitoring device
3a, b Monitoring units
4, 4R, 4G, 4B Respective signal encoders
5, 5R, 5G, 5B Respective test signal output or connecting point of two dipoles
6 Vehicle state signal input
7 Human-machine interface
S1, S1R, S1G, S1B Respective first switches
S2, S2R, S2G, S2B Respective second switches
R1,R1R, R1G, R1B Respective resistor, in particular for limiting the current through the
assigned signal encoder
R2,R2R, R2G, R2B Respective pulldown resistor
Vsup Operating voltage connection
GND Earth connection
PS,PSR, PSG, PSB Test signals

The invention claimed is:

1. A method for the automated monitoring of a vehicle state-signalling device for signalling an activated, at least partially automated, driving operating state of a motor vehicle, the method comprising:
   assigning a level of safety-relevance to an assigned signal encoder of the motor vehicle, wherein the level of safety-relevance is related to a current vehicle driving mode of the motor vehicle, wherein the current vehicle driving mode is one of manual driving, partially autonomous driving, and fully autonomous driving;
   transferring a first control signal to the vehicle state-signalling device, wherein the first control signal is configured to change the assigned signal encoder of the vehicle state-signalling device into a deactivated state;
   subsequently testing a current actual operating state of the assigned signal encoder; and
   triggering at least one assigned fault remedying action based on the testing and the level of safety-relevance assigned to the assigned signal encoder, wherein the testing reveals that the assigned signal encoder is in an activated state despite the transferred first control signal, and
   wherein the method is carried out according to the level of safety-relevance assigned to the assigned signal encoder and a vehicle state of the motor vehicle, wherein the vehicle state is a condition of the motor vehicle that requires an operation of an optical, acoustic, or haptic state signal of the assigned signal encoder, and wherein the vehicle state is assigned individually to the assigned signal encoder.

2. The method according to claim 1, wherein the at least one assigned fault remedying action comprises outputting a second control signal which is independent of the first control signal and is configured to trigger at least one of the following processes:
   changing the vehicle state-signalling device into a safe state; and
   outputting a fault message at a human-machine Interface.

3. The method according to claim 2, wherein the second control signal is configured to cause the vehicle state-signalling device to change into the safe state by self-deactivating the vehicle state-signalling device or by selective deactivation of the assigned signal encoder.

4. The method according to claim 1, wherein the method is carried out repeatedly.

5. The method according to claim 1,
   wherein the vehicle state-signalling device has a multiplicity of assigned signal encoders which differ from one another, at least in one signalling aspect, and the method is selectively only implemented on a first subset of the multiplicity of assigned signal encoders of the vehicle state-signalling device, wherein each of the assigned signal encoders in the first subset is assigned an identical level of safety-relevance, and
   wherein the method is implemented on one or more predetermined combinations of the multiplicity of assigned signal encoders from the first subset.

6. A monitoring device which is configured to carry out the method according to claim 1 with respect to the vehicle state-signalling device.

7. The monitoring device according to claim 6, comprising: at least one test device which is configured to test a test signal which is output at at least one test signal output of the vehicle state-signalling device to determine, based on the testing, a current operating state of the assigned signal encoder of the vehicle state-signalling device.

8. A computer program which is configured to carry out, when it is run on a monitoring device, the method according to claim 1.

9. A vehicle state-signalling device for signalling an activated, at least partially automated, driving operating state of a motor vehicle, comprising:
   an assigned signal encoder which is configured to output a state signal for signalling a vehicle state assigned to the assigned signal encoder; and
   a circuit for actuating the assigned signal encoder to selectively activate or deactivate the assigned signal encoder in reaction to at least one corresponding control signal, which is transferred by a monitoring device, wherein the monitoring device is configured to carry out a method comprising:
      assigning a level of safety-relevance to the assigned signal encoder of the motor vehicle, wherein the level of safety-relevance is related to a current vehicle driving mode of the motor vehicle, wherein the current vehicle driving mode is one of manual driving, partially autonomous driving, and fully autonomous driving;
      transferring a first control signal to the vehicle state-signalling device wherein the first control signal is configured to change the assigned signal encoder of the vehicle state-signalling device into a deactivated state;
      subsequently testing a current actual operating state of the assigned signal encoder; and
      triggering at least one assigned fault remedying action based on the testing and the level of safety-relevance assigned to the assigned signal encoder, wherein the testing reveals that the assigned signal encoder is in an activated state despite the transferred first control signal;
      wherein the method is carried out according to the level of safety-relevance assigned to the assigned signal encoder and the vehicle state of the motor vehicle, wherein the vehicle state is a condition of the motor vehicle that requires an operation of an optical, acoustic, or haptic state signal of the assigned signal encoder, and wherein the vehicle state is assigned individually to the assigned signal encoder;
   wherein the circuit comprises:
      a first switch and a second switch which are configured to be switched independently thereof; and
      at least one test signal output for making available a test signal for testing a current operating state of the assigned signal encoder; and wherein the circuit is configured to activate the assigned signal encoder by requiring that the first switch and the second switch have a specific predetermined switched state combination, wherein switched state combinations of the first switch and the second switch which do not correspond to the specific predetermined switched state combination of the first switch and the second switch correspond to deactivation of the assigned signal encoder.

10. The vehicle state-signalling device according to claim 9, wherein:
the circuit has a voltage divider with a first dipole and a second dipole which are connected in series, and the at least one test signal output starts from a circuit point which is located between the first dipole and the second dipole,
the first switch and the second switch are arranged in the first dipole, and the assigned signal encoder is arranged in the second dipole, and
the assigned signal encoder is activated by an operating voltage applied via the voltage divider only when the first switch and the second switch are each simultaneously in a closed switched state.

11. The vehicle state-signalling device according to claim 9, wherein:
the circuit has a voltage divider with a first dipole and a second dipole which are connected in series, and the at least one test signal output starts from a circuit point which is located between the first dipole and the second dipole,
the first switch is arranged in the first dipole, and the assigned signal encoder and the second switch are arranged in the second dipole, and
the assigned signal encoder is activated by an operating voltage applied via the voltage divider only when the first switch and the second switch are each simultaneously in a closed switched state.

12. The vehicle state-signalling device according to claim 11, wherein:
the second switch of the second dipole is connected parallel to the assigned signal encoder of the second dipole, and
the assigned signal encoder is activated by the operating voltage applied via the voltage divider only when, simultaneously, the first switch is in the closed switched state and the second switch is in an opened switched state.

13. The vehicle state-signalling device according to claim 10, wherein the voltage divider is a loaded voltage divider in which the second dipole has a load which is connected parallel to the assigned signal encoder.

14. A system for monitored vehicle state signalling of an activated, at least partially automated, driving operating state of a motor vehicle, the system comprising:
a vehicle state-signalling device comprising:
an assigned signal encoder configured to output a state signal for signalling a vehicle state assigned to the assigned signal encoder; and
a circuit for actuating the assigned signal encoder to selectively activate or deactivate the assigned signal encoder in reaction to at least one corresponding control signal, which is transferred by a monitoring device;
wherein the circuit comprises:
a first switch and a second switch configured to be switched independently thereof; and
at least one test signal output for making available a test signal for testing a current operating state of the assigned signal encoder; and
wherein the circuit is configured to activate the assigned signal encoder by requiring that the first switch and the second switch have a specific predetermined switched state combination, wherein switched state combinations of the first switch and the second switch which do not correspond to the specific predetermined switched state combination of the first switch and the second switch correspond to deactivation of the assigned signal encoder; and
the monitoring device configured to carry out a method comprising:
assigning a level of safety-relevance to the assigned signal encoder of the motor vehicle, wherein the level of safety-relevance is related to a current vehicle driving mode of the motor vehicle, wherein the current vehicle driving mode is one of manual driving, partially autonomous driving, and fully autonomous driving;
transferring a first control signal to the vehicle state-signalling device wherein the first control signal is configured to change the assigned signal encoder of the vehicle state-signalling device into a deactivated state;
subsequently testing a current actual operating state of the assigned signal encoder; and
triggering at least one assigned fault remedying action based on the testing and the level of safety-relevance assigned to the assigned signal encoder, wherein the testing reveals that the assigned signal encoder is in an activated state despite the transferred first control signal;
wherein the method is carried out according to the level of safety-relevance assigned to the assigned signal encoder and the vehicle state of the motor vehicle, wherein the vehicle state is a condition of the motor vehicle that requires an operation of an optical, acoustic, or haptic state signal of the assigned signal encoder, and wherein the vehicle state is assigned individually to the assigned signal encoder; and
wherein the monitoring device comprises at least one test device which is configured to test the test signal which is output at the at least one test signal output of the vehicle state-signalling device to determine, based on the testing, the current operating state of the assigned signal encoder of the vehicle state-signalling device.

15. The system according to claim 14, wherein:
the system is divided between two or more apparatuses, wherein the two or more apparatuses are different,
the first switch and the second switch of the vehicle state-signalling device are arranged in two switch-containing apparatuses of the two or more apparatuses, wherein the two switch-containing apparatuses are different,
the at least one test signal output of the vehicle state-signalling device is connected to at least two of the two or more apparatuses, and the at least two of the two or more apparatuses are each configured to carry out the method, individually or together with respect to the vehicle state-signalling device of the system.

16. The system according to claim 14, wherein:
the vehicle state-signalling device has a multiplicity of assigned signal encoders which differ from one another at least in one signalling aspect; and wherein the monitoring device of the vehicle state-signalling device is configured to implement the method selectively for each of the multiplicity of assigned signal encoders.

17. The system according to claim 16, configured to selectively deactivate one of the multiplicity of assigned signal encoders, wherein the deactivation is based on a result of the testing that reveals that the one of the multiplicity of assigned signal encoders is in an activated operating state despite the corresponding transferred first control signal.

18. A vehicle having the system according to claim 14.

* * * * *